(12) United States Patent
Totani

(10) Patent No.: US 10,305,000 B2
(45) Date of Patent: May 28, 2019

(54) METHOD FOR PRODUCING LIGHT-EMITTING DEVICE

(71) Applicant: TOYODA GOSEI CO., LTD., Kiyosu-shi (JP)

(72) Inventor: Shingo Totani, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/801,969

(22) Filed: Nov. 2, 2017

(65) Prior Publication Data

US 2018/0145226 A1    May 24, 2018

(30) Foreign Application Priority Data

Nov. 24, 2016  (JP) ................................ 2016-227535

(51) Int. Cl.
*H01L 33/00* (2010.01)
*H01L 33/32* (2010.01)
*H01L 33/40* (2010.01)

(52) U.S. Cl.
CPC ........ *H01L 33/405* (2013.01); *H01L 33/0075* (2013.01); *H01L 33/32* (2013.01); *H01L 2933/0016* (2013.01)

(58) Field of Classification Search
CPC ..... H01L 21/28273; H01L 2924/12041; H01L 33/405; H01L 33/0075; H01L 33/32
See application file for complete search history.

(56) References Cited

U.S. PATENT DOCUMENTS

| 6,130,446 A * | 10/2000 | Takeuchi .......... H01L 21/28575 257/754 |
| 2003/0207480 A1 | 11/2003 | Kobayashi et al. |
| 2005/0062051 A1* | 3/2005 | Kwak .................. H01L 33/405 257/79 |
| 2011/0037092 A1* | 2/2011 | Hori ...................... H01L 33/405 257/98 |
| 2014/0021442 A1* | 1/2014 | Inazu .................... H01L 33/405 257/13 |
| 2014/0197374 A1* | 7/2014 | Hwang ................ H01L 33/405 257/13 |
| 2015/0028356 A1* | 1/2015 | Lee ........................ H01L 27/15 257/79 |

FOREIGN PATENT DOCUMENTS

JP    2000-307184 A    11/2000

* cited by examiner

*Primary Examiner* — Jaehwan Oh
*Assistant Examiner* — John M Parker
(74) *Attorney, Agent, or Firm* — McGinn IP Law Group, PLLC.

(57) ABSTRACT

A sacrificial layer is formed on a region for forming the reflective electrode later on the p-type layer, Subsequently, a part of the p-type layer is dry etched to expose an n-type layer. Then, a resist layer having an opening is formed through photolithography on the p-type layer and the n-type layer exposed in the previous step. The opening has a pattern to enclose the sacrificial layer in a plan view. Next, the sacrificial layer is wet etched using a buffered hydrofluoric acid to remove the entire sacrifice layer. Subsequently, a reflective film is formed by sputtering on the p-type layer and the resist layer. Next, the resist layer is removed using a resist stripper, and only the reflective film on the p-type layer is left to form the reflective electrode.

11 Claims, 5 Drawing Sheets

METHOD FOR PRODUCING LIGHT-EMITTING DEVICE

BACKGROUND OF THE INVENTION

Field of the Invention

The present invention relates to a method for producing a Group III nitride semiconductor light-emitting device having a reflective electrode on a p-type layer.

Background Art

In a flip-chip type Group III nitride semiconductor light-emitting device, an electrode (reflective electrode) also serving as a reflective film is formed on a p-type layer to reflect light toward the rear surface of a substrate, thereby improving the light extraction efficiency. The reflective electrode is often made of Ag or Ag alloy. In addition, Ru, Rh, Pt, or Al is known to be used as a material of the reflective electrode.

Japanese Patent Application Laid-Open (kokai) No. 2000-307184 discloses a method for forming a p-electrode on a p-type layer as follows. Firstly, an insulating film is formed on the entire top surface of a device, a resist is formed on the insulating film, and a part of the resist is removed to make an opening. Subsequently, the residue of resist in the opening is removed by asking. Then, the insulating film of the opening is removed by wet etching to expose the surface of the p-type layer, and a p-electrode is formed through lift-off on the p-type layer exposed in the opening. By the above method, a p-electrode can be formed on a clean p-type layer having no residue of resist.

When the reflective electrode is patterned through lift-off, a resist is applied to the top surface of the p-type layer so that the residue sometimes remains on the p-type layer after the removal of the resist. Such residue of resist increases the contact resistance between the reflective electrode and the p-type layer. Therefore, a reflective electrode made of Ag is conventionally patterned by wet etching. However, in case of Ag, there is a problem that restriction is imposed on the process after the formation because the reflectance is decreased by chemical liquid or heat treatment. In case of Ag alloy, restriction is imposed on the material type to be wet etchable.

A platinum based material such as Ru, Rh, and Pt is difficult to be wet etched. When the reflective electrode has a layered structure, patterning by wet etching is difficult because each of the layers must be wet etchable, or the layers have different etching rates. Therefore, the reflective electrode needs to be pattered through lift-off when these materials or a layered structure are employed. As described above, however, a problem arises in the lift-off method that the contact resistance is increased.

Thus, in the conventional method for forming a reflective electrode, it was difficult to achieve a wide selection of materials or structures of the reflective electrode while suppressing the increase of the contact resistance.

In Japanese Patent Application Laid-Open (kokai) No. 2000-307184, an insulating film is formed after dry etching is performed to expose the n-type layer. In the dry etching process, resist is used as a mask, and the resist comes into contact with the top surface of the p-type layer before the formation of the insulating film. Therefore, even if the resist is removed, the residue of resist may remain on the p-type layer. Thus, for the method disclosed in Japanese Patent Application Laid-Open (kokai) No. 2000-307184, the contact resistance between the p-type layer and the reflective electrode may be increased. Since the insulating film is formed on the entire top surface of a device, it is difficult to dispose an opening at a desired position depending on the shape of the device. Since a part of the insulating film is removed, it is sometimes difficult to widely expose the p-type layer. As a result, a desired contact area cannot be obtained in some cases. The area of the reflective electrode is reduced, causing the decrease of the reflectance and the increase of the contact resistance.

SUMMARY OF THE INVENTION

In view of the foregoing, an object of the present invention is to provide a method for producing a light-emitting device having a reflective electrode on a p-type layer, wherein the increase of the contact resistance is suppressed, and the material or structure of the reflective electrode is widely selected.

The present invention provides a method for producing a Group III nitride semiconductor light-emitting device having a reflective electrode on a p-type layer, the method comprising: a sacrificial layer formation step of forming a sacrificial layer on a region for forming a reflective electrode later on the p-type layer, a resist layer formation step of forming a resist layer with an opening on the p-type layer, the opening exposing a surface of the sacrificial layer in a bottom of the opening, a sacrificial layer removal step of removing the sacrificial layer entirely by wet etching, a reflective film formation step of forming a reflective film on the p-type layer and the resist layer, a reflective electrode formation step of forming the reflective electrode by removing the resist layer and the reflective film on the resist layer to leave the reflective film on the p-type layer.

In the resist layer formation step, a resist layer may be continuously formed over the ends of the surface of the sacrificial layer so that the center of the surface of the sacrificial layer is exposed by the opening and the ends of the surface of the sacrificial layer are not exposed. In this case, the entire surface of the p-type layer in contact with the reflective electrode is a clean surface with which the resist layer does not come into contact, thereby further suppressing the increase of the contact resistance. A level difference is generated due to recess at the side surface lower parts of the opening by the sacrificial layer removal step. At this part, the reflective film can be accurately separated, thereby further improving the pattern accuracy of the reflective electrode.

In the resist layer formation step, the resist layer may be formed so that the opening encloses the sacrificial layer in a plan view and a space is provided between a side surface of the sacrificial layer and a side surface of the resist layer. The entire sacrificial layer can be easily removed in the sacrificial layer removal step because the sacrificial layer does not come into contact with the resist layer.

Dry etching is preferably performed to expose the n-type layer for forming an n-electrode before the resist layer formation step after the sacrificial layer formation step and. It is because no restriction is imposed on the type of resist stripper or the post treatment method such as heat treatment and asking after resist removal with respect to a resist mask used for dry etching.

The present invention is effective when the reflective electrode is made of a material comprising at least one selected from a group consisting of Ru, Rh, and Pt, or Ag alloy material containing Au, and when the reflective electrode is a layered film. The present invention is effective specifically to an ultraviolet light-emitting device. The method for producing a light-emitting device according to the present invention has no restriction on the material type or structure of the reflective electrode. Therefore, a material having an optimum reflectance according to the emission wavelength, or a material or structure superior in the reduction of contact resistance or in the environment resistance can be employed.

By the method for producing a light-emitting device according to the present invention, a reflective electrode can be formed on a clean surface of the p-type layer having no residue of resist. Therefore, a forward voltage of the light-emitting device can be reduced. The method for producing a light-emitting device according to the present invention has no restriction on the material or structure of the reflective electrode. Thus, an optimum material having a higher reflectance according to the emission wavelength can be selected, and the reflective electrode can be a layered film, thereby improving the light output.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
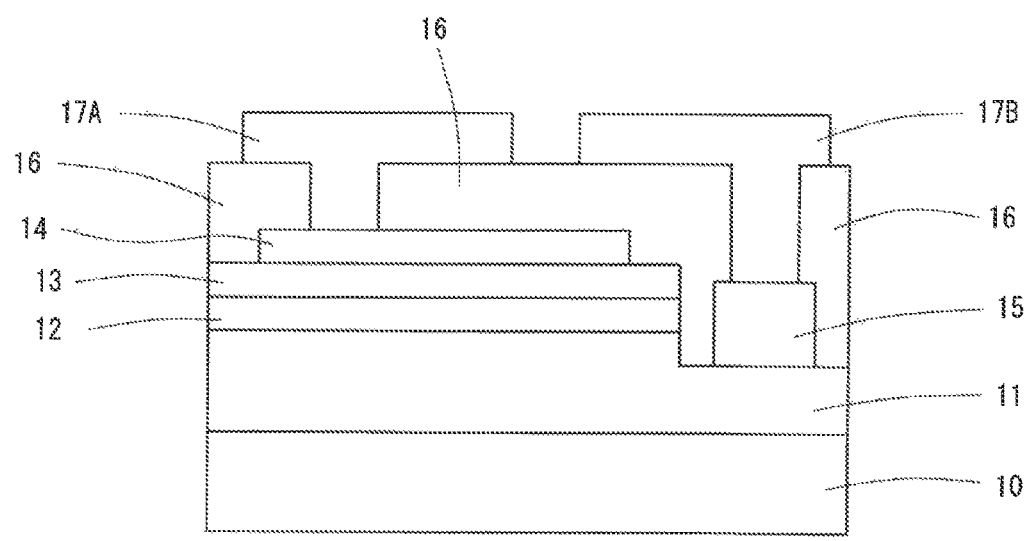
FIG. 1 is a sketch showing the structure of a light-emitting device according to Embodiment 1.

FIG. 1 is a sketch showing the structure of a light-emitting device according to Embodiment 1. As shown in FIG. 1, the light-emitting device according to Embodiment 1 comprises a substrate 10, an n-type layer 11, a light-emitting layer 12, and a p-type layer 13 sequentially deposited via a buffer layer (not illustrated) on the substrate 10, a reflective electrode 14 formed on the p-type layer 13, an n-electrode 15, a protective film 16, and junction electrodes 17A and 17B. The light-emitting device according to Embodiment 1, is a flip-chip type device which extracts light from the rear surface of the substrate 10 (the surface opposite to the surface in contact with the n-type layer 11).

The substrate 10 is a growth substrate for forming a Group III nitride semiconductor on the main surface thereof. The surface on the n-type layer 11 side of the substrate 10 has an uneven structure, thereby improving the light extraction efficiency. The substrate 10 may be made of a material other than sapphire, such as Si, GaN, SiC, and ZnO.

The n-type layer 11, the light-emitting layer 12, and the p-type layer 13 may have any structure conventionally employed as the structure of a light-emitting device. For example, the n-type layer 11 has a structure in which an n-type contact layer made of n-GaN, an electrostatic breakdown preventing layer formed by sequentially depositing undoped GaN and n-GaN, and an n-type superlattice layer formed by alternately and repeatedly depositing n-GaN and InGaN, are sequentially deposited. The light-emitting layer 12 has a MQW structure in which a plurality of layer units are repeatedly deposited, each layer unit comprising a well layer made of InGaN, a cap layer made of GaN or AlGaN, and a barrier layer made of AlGaN sequentially deposited. The p-type layer 13 has a structure in which a p-type cladding layer formed by alternately and repeatedly depositing p-AlGaN and p-InGaN and a p-type contact layer made of p-GaN are sequentially deposited.

On a part of the surface of the p-type layer 13, a trench having a depth reaching the n-type layer 11 is formed. The trench exposes the surface of the n-type layer 11 to form the n-electrode 15.

The reflective electrode 14 is formed on a region except the ends on the p-type layer 13. The reflective electrode 14 has a layered structure of Ag alloy/Ti/Au/Al. Ag alloy refers to an alloy containing Ag as a main constituent element. The symbol "/" means depositing, and A/B means a layered structure in which a layer of A is first formed and a layer of B is then formed. The symbol "/" will be used in the same meaning in the description of materials provided below. The layers of the reflective electrode 14 have thicknesses of 100 nm, 100 nm, 1500 nm, and 10 nm respectively in the deposition order.

The structure or material of the reflective electrode 14 is not limited to the above, and any material or structure may be employed. For example, the reflective electrode 14 of Embodiment 1 is a layered film, but it may be a single layer, e.g., a single layer of Ag or Ag alloy. In Embodiment 1, Ag alloy difficult to wet etch may be used, for example, an Ag alloy containing Au may be used because no restriction is imposed on the type of Ag alloy.

The reflective electrode 14 may be made of a material with a high reflectance according to the emission wavelength. For example, in case of the ultraviolet light-emitting device, a material with a high reflectance in the UV region (e.g. 400 nm or less) may be used. A material containing a platinum based material such as Ru, Rh, and Pt may be used, and also a single layer made of Ru, Rh, and Pt, or a layered film containing the single layer may be used. Alternatively, a layered film containing an Al film may be used.

When the reflective electrode 14 is a layered film, a structure in which the lowest layer (layer in contact with the p-type layer 13) is a Ni film may be employed. Thereby, the contact resistance between the reflective electrode 14 and the p-type layer 13 can be further reduced.

The n-electrode 15 is formed on the n-type layer 11 exposed in the bottom of the trench. The n-electrode 15 comprises Ti/Al/Ti/Au/Al, and the thicknesses of the layers are 1 nm, 100 nm, 100 nm, 1500 nm, and 10 nm respectively in the deposition order.

The protective film 16 is continuously formed on the reflective electrode 14, the n-type layer 11, and the n-electrode 15 so as to cover the entire top surface of the device. The protective film 16 is made of $SiO_2$, and has a thickness of 300 nm.

The junction electrodes 17A and 17B are formed apart each other on the protective film 16. The protective film 16 has through holes passing through the protective film 16. The junction electrode 17A and the reflective electrode 14, the junction electrode 17B and the n-electrode 15 are respectively connected via the holes. Each of the junction electrodes 17A and 17B comprises Ti/AuSn/Au, and the thicknesses of the layers are 100 nm, 3000 nm, and 50 nm respectively in the deposition order.

Next, a method for producing a light-emitting device according to Embodiment 1 will be described with reference to FIGS. 2A to 4C.

(Semiconductor Layer Formation Step)

Figure 2A:
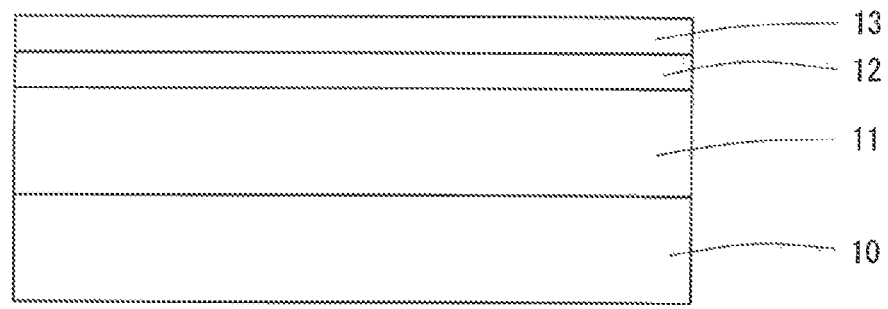
FIGS. 2A to 2C are sketches showing processes for producing a light-emitting device according to Embodiment 1.

Firstly, on the substrate 10, through MOCVD, a buffer layer (not illustrated), an n-type layer 11, a light-emitting layer 12, and a p-type layer 13 are sequentially deposited (refer to FIG. 2A). In MOCVD, the following raw material gases are employed: ammonia ($NH_3$) as a nitrogen source; trimethylgallium ($Ga(CH_3)_3$: TMG) as a Ga source; trimethylindium ($In(CH_3)_3$: TMI) as an In source; trimethylaluminum ($Al(CH_3)_3$: TMA) as an Al source; silane ($SiH_4$) as an n-type dopant gas; bis(cyclopentadienyl)magnesium (Mg ($C_5HO_2$: $CP_2Mg$) as a p-type dopant gas; and $H_2$ and $N_2$ as carrier gases.

(Sacrificial Layer Formation Step)

Subsequently, a layer of $SiO_2$ is uniformly formed on an entire surface of the p-type layer 13 through CVD. A sacrificial layer 20 made of $SiO_2$ having a thickness of 100 nm is formed on a region for forming a reflective electrode 14 later on the p-type layer 13 by photolithography and etching (refer to FIG. 2B). The sacrificial layer 20 is a layer for preventing the resist from coming into contact with the region, on which the reflective electrode 14 is to be formed, of the surface of the p-type layer 13. The sacrificial layer 20 is entirely removed in the subsequent step.

The material of the sacrificial layer 20 is not limited to $SiO_2$, any material may be used as long as it can be wet etched by an acid-based etching liquid. For example, other than $SiO_2$, an insulating material such as $TiO_2$, $Al_2O_3$, AlN, and $Si_3N_4$, a transparent conductive material such as ITO (Indium Tin Oxide), IZO (Indium Zinc Oxide), ICO (Indium-Cerium-Oxide), $In_2O_3$, $SnO_2$, and ZnO, and a metal material such as Ti may be used.

The thickness of the sacrificial layer 20 is not limited to 100 nm. The sacrificial layer 20 may be formed so as to have any thickness as long as the thickness can be removed by wet etching. For example, the thickness is preferably within a range of 20 nm to 200 nm because it can be easily removed.

The sacrificial layer 20 may be formed through any method other than CVD, for example, sputtering or vapor deposition.

(n-Type Layer Exposure Step)

Figure 2B:
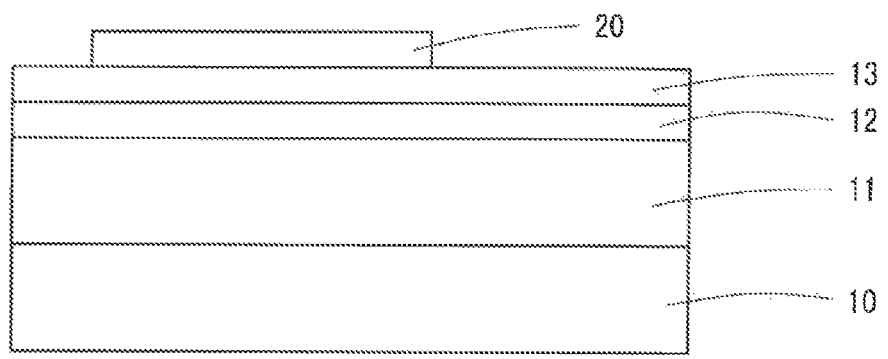
Figure 2C:
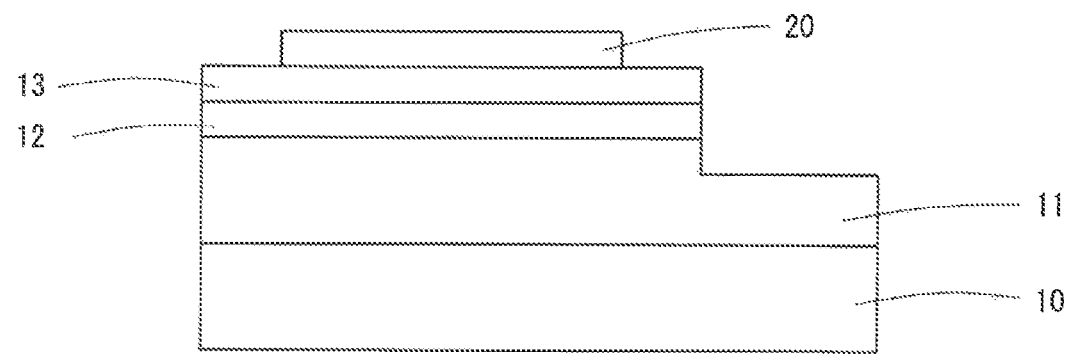

Next, the surface of the p-type layer 13 is partially dry etched, thereby to expose the n-type layer 11 (refer to FIG. 2C). In the dry etching, a resist mask formed through photolithography is used. Since the sacrificial layer 20 is formed on a prescribed region on the p-type layer 13, the surface of the p-type layer 13 below the sacrificial layer 20 does not come into contact with the resist so that it can be kept clean.

(Resist Layer Formation Step)

Figure 3A:
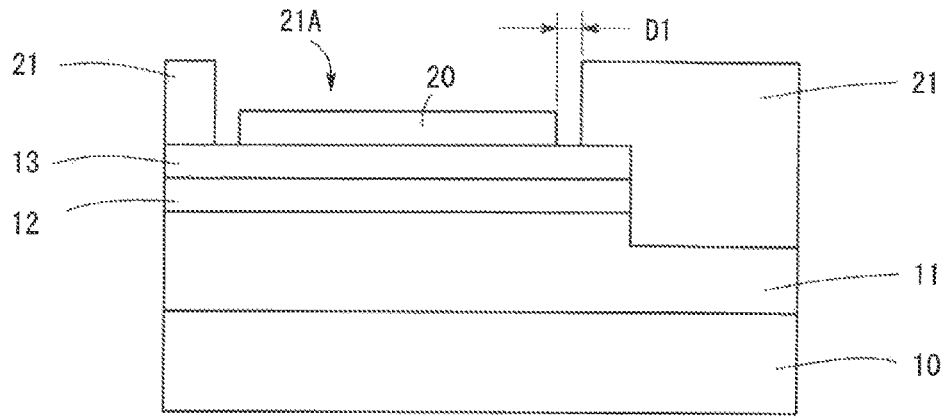
FIGS. 3A to 3D are sketches showing processes for producing a light-emitting device according to Embodiment 1.

Next, a resist layer 21 having an opening 21A is formed through photolithography on the p-type layer 13 and the n-type layer 11 exposed in the previous step (refer to FIG. 3A). In this case, the surface of the p-type layer 13 below the sacrificial layer 20 does not come into contact with the resist so that it can be kept clean. The opening 21A has a pattern to enclose the sacrificial layer 20 in a plan view. That is, the contour of the sacrificial layer 20 is disposed inside the contour of the opening 21A. A space with distance D1 between both contours is provided to prevent the sacrificial layer 20 from coming into contact with the resist layer 21.

The space with the distance D1 is provided between the sacrificial layer 20 and the resist layer 21. A region (i.e., the space) corresponding to the distance D1 on the p-type layer 13 is a region with which the resist came into contact to form the resist layer 21, and the reflective electrode 14 is formed later even on that region. Therefore, to further suppress the increase of the contact resistance, the distance D1 between the sacrificial layer 20 and the resist layer 21 is preferably made as small as possible. For example, the distance D1 is preferably 5 µm or less, more preferably, 3 µm or less, and further preferably, 2 µm or less. The lower limit of the distance D1 is, for example, 1 µm or more depending on the patterning accuracy.

The resist is made of, for example, positive inversion type resist such as AZ5214 (made by AZ Electronic Materials Ltd.) or AZ5200NJ (made by AZ Electronic Materials Ltd.). Needless to say, the resist material is not limited to these, any material may be used as long as it has a resistance to the wet etching solution for the sacrificial layer in the subsequent step.

After patterning of the resist layer 21, the resist is sometimes left thin on the sacrificial layer 20. After patterning the resist layer 21, photo-excited asking is preferably performed to remove the resist on the sacrificial layer 20, thereby facilitating wet etching of the sacrificial layer 20 in the subsequent step.

The opening 21A of the resist layer 21 may have any pattern as long as the opening 21A encloses the sacrificial layer 20 in a plan view. The pattern of the opening 21A preferably has a similar enlarged shape as the pattern of the sacrificial layer 20. The distance D1 between the sacrificial layer 20 and the resist layer 21 is uniform, thereby facilitating the removal of the entire sacrificial layer 20 in the subsequent step.

(Sacrificial Layer Removal Step)

Figure 3B:
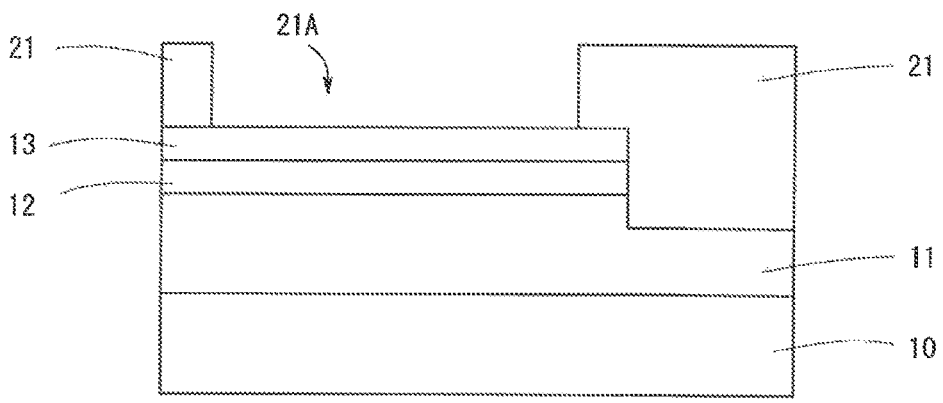

Next, the entire sacrificial layer 20 is removed by wet etching using a buffered hydrofluoric acid (refer to FIG. 3B). The etching solution is not limited to a buffered hydrofluoric acid, and any acid-based etching solution may be used. Such acid-based etching solution can etch only the sacrificial layer 20 without etching the resist layer 21. The removal of the entire sacrificial layer 21 is easy because the sacrificial layer 20 does not contact with the resist layer 21. The reason for removing the entire sacrificial layer 20 is that when the sacrificial layer 20 is left, the contact area between the p-type layer 13 and the reflective electrode 14 is reduced, and the contact resistance is increased. Through removing the sacrificial layer 20, a clean surface with which the resist has not come into contact is exposed in a region for forming the reflective electrode 14 on the surface of the p-type layer 13.

(Reflective Film Formation Step)

Figure 3C:
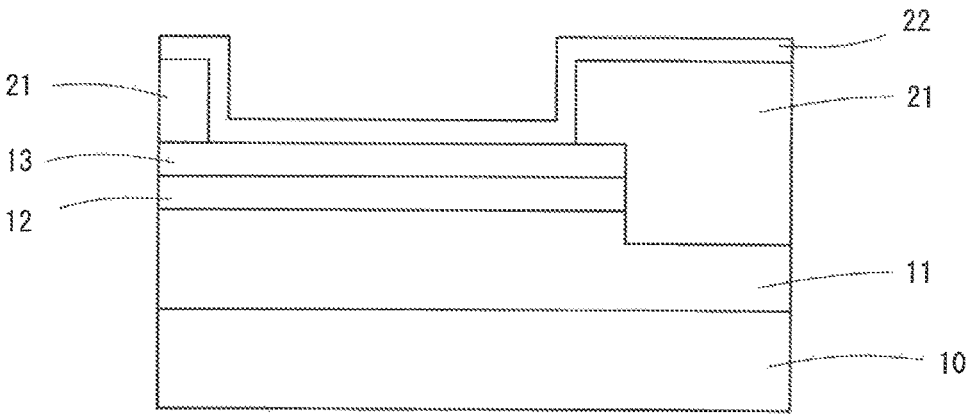
Figure 3D:
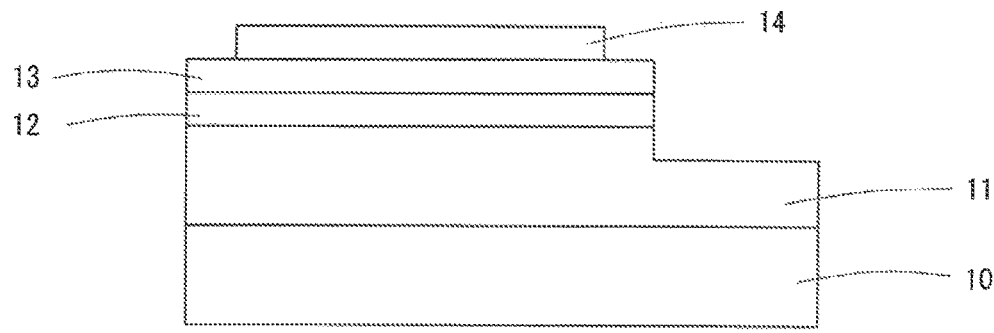

Next, a reflective film 22 is formed by sputtering on the p-type layer 13 and the resist layer 21 (refer to FIG. 3C). Vapor deposition may be used other than sputtering. The larger part of the p-type layer 13 is a clean region where the sacrificial layer 20 has been formed and the resist has not come into contact with. Therefore, the surface of the p-type layer 13 in contact with the reflective film 22 is mostly a clean surface.

(Reflective Electrode Formation Step)

Next, the resist layer 21 is removed using a resist stripper. The reflective film 22 on the resist layer 21 is removed, and only the reflective film 22 on the p-type layer 13 is left to form the reflective electrode 14 (refer to FIG. 3D). Through the above, the reflective electrode 14 is formed on the clean surface of the p-type layer 13 with which the resist has not come into contact. Thereafter, heat treatment may be performed to reduce the contact resistance as needed.

(n-Electrode Formation Step)

Figure 4A:
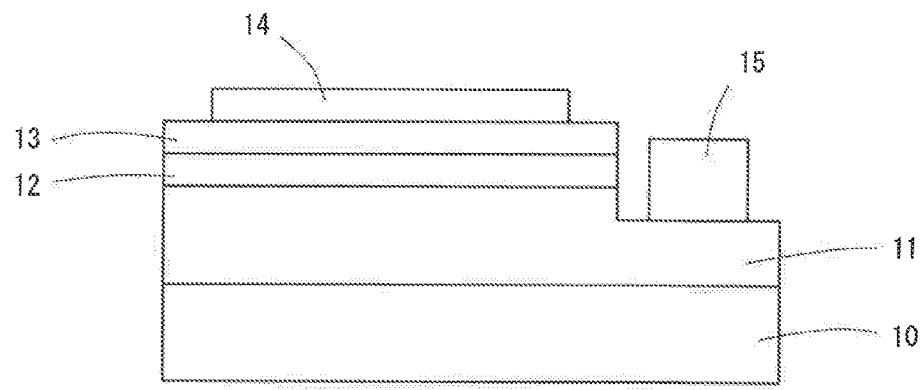
FIGS. 4A to 4C are sketches showing processes for producing a light-emitting device according to Embodiment 1.
Figure 4B:
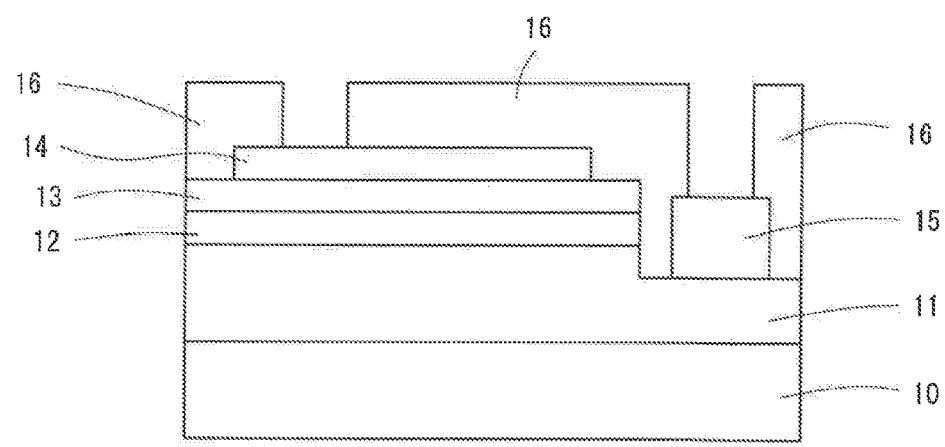
Figure 4C:
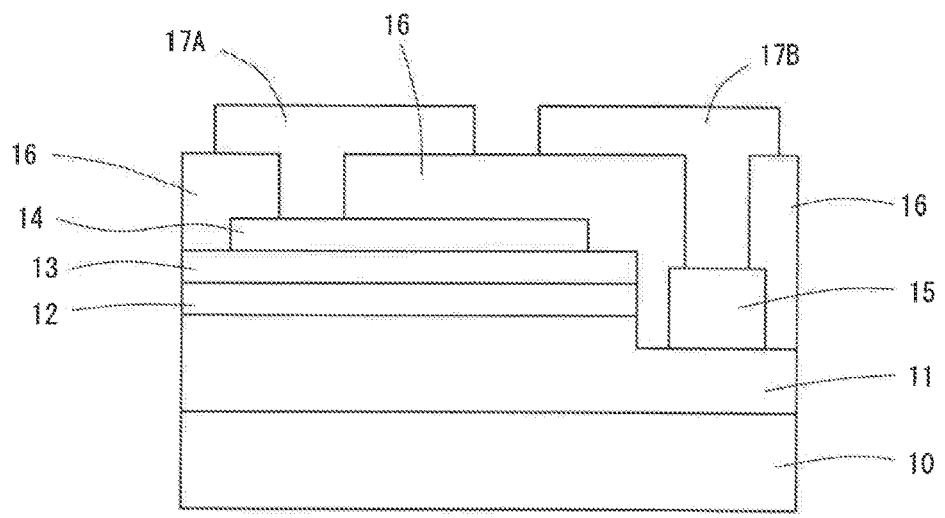

Subsequently, on the n-type layer 11 exposed by etching in the bottom of the trench, an n-electrode 15 is formed by sputtering (refer to FIG. 4A). The n-electrode 15 is patterned through lift-off.

(Protective Film Formation Step)

Next, a protective film 16 having a thickness of 300 nm is formed through CVD method on the entire top surface of the light-emitting device. That is, the protective film 16 is continuously formed over the reflective electrode 14, the p-type layer 13, the n-type layer 11, and the n-electrode 15. Some holes are formed in an individual part of the protective film 16, and the respective parts of the reflective electrode 14 and the respective parts of the n-electrode 15 are exposed in the bottom of the hole (refer to FIG. 4B). The holes are formed by forming a resist mask through photolithography and by wet etching using a buffered hydrofluoric acid.

(Junction Electrode Formation Step)

Next, a junction electrode 17A and a junction electrode 17B are formed apart from each other on the protective film 16. The junction electrode 17A is contacted with the reflective electrode 14 exposed in the bottoms of the holes of the protective film 16. The junction electrode 17B is contacted with the n-electrode 15 exposed in the bottoms of the holes of the protective film 16 (refer to FIG. 4C). Film formation is carried out through vapor deposition, and patterning is performed through lift-off. The above is a method for producing a light-emitting device according to Embodiment 1.

In the method for producing a light-emitting device according to Embodiment 1, the reflective electrode 14 can be formed on the p-type layer 13 without bringing the resist into contact with a region for forming the reflective electrode 14 of the surface of the p-type layer 13. Therefore, the increase of the contact resistance between the p-type layer 13 and the reflective electrode 14 can be suppressed without causing the residue of resist on the surface of the p-type layer 13. Since the reflective electrode 14 is formed through lift-off, a wide selection of materials or structures of the reflective electrode 14 is available. Thus, a material or structure having an optimum reflectance according to emission wavelength can be employed, or a material or structure more suitable for suppression of migration can be employed. As a result, the forward voltage is reduced and the light output is improved.

The present invention is effective for example when Ag alloy containing Au, platinum based material such as Ru, Rh, and Pt, and a layered film is used. These materials or layered structure have to be patterned through lift-off because wet etching is difficult. As a result, the residue of resist may remain on the p-type layer 13, causing the increase of the contact resistance. However, according to the present invention, the reflective electrode 14 can be formed on the clean surface of the p-type layer 13 with which the resist has not come into contact. Therefore, even when the reflective electrode 14 is made of a material difficult to wet etch or has a layered structure, the increase of the contact resistance can be suppressed.

The present invention is effective particularly for an ultraviolet light-emitting device, for example, a light-emitting device having an emission wavelength of 400 nm or less. Ag or Ag alloy widely used as a material of the reflective electrode 14 in a blue light-emitting device, can be patterned by wet etching. This prevents the problem of the increase of the contact resistance due to the residue of resist, but the reflectance is low in the ultraviolet region. Therefore, the reflective electrode 14 of the ultraviolet light-emitting device is preferably made of a platinum based material such as Ru, Rh, and Pt having a high reflectance in the ultraviolet region. The platinum based material is difficult to be patterned by wet etching. When the reflective electrode 14 is made of such a platinum based material, it is necessary that patterning is performed through lift-off. Thus, according to the present invention, even in the ultraviolet light-emitting device in which the reflective electrode 14 is made of a material having a high reflectance in the ultraviolet region, the increase of the contact resistance can be suppressed, thereby reducing the forward voltage and improving the light output.

The present invention is effective particularly when the reflective electrode 14 has a layered structure. When the reflective electrode 14 has a layered structure, patterning by wet etching was difficult because each of the layers must be wet etchable, or the layers have different etching rates. Therefore, when the reflective electrode 14 has a layered structure, the reflective electrode needed to be pattered through lift-off. Thus, according to the present invention, even in the light-emitting device in which the reflective electrode 14 has a layered structure, the increase of the contact resistance can be suppressed, thereby reducing the forward voltage and improving the light output. Particularly when the layered structure of the reflective electrode 14 has a Ni film as the lowest layer (the layer in contact with the p-type layer 13), the contact resistance with the p-type layer 13 can be further reduced. When the layered structure has an Al film, the reflectance is high in the ultraviolet region. Thus, a low cost reflective electrode 14 is achieved, thereby improving the light output of the ultraviolet light-emitting device and reducing the cost.

Embodiment 2

In Embodiment 2, the formation step of forming the resist layer 21 and the subsequent removal step of removing the sacrificial layer 20 in FIGS. 3A to 3D are replaced with the following steps. Other steps are the same as in Embodiment 1.

Figure 5A:
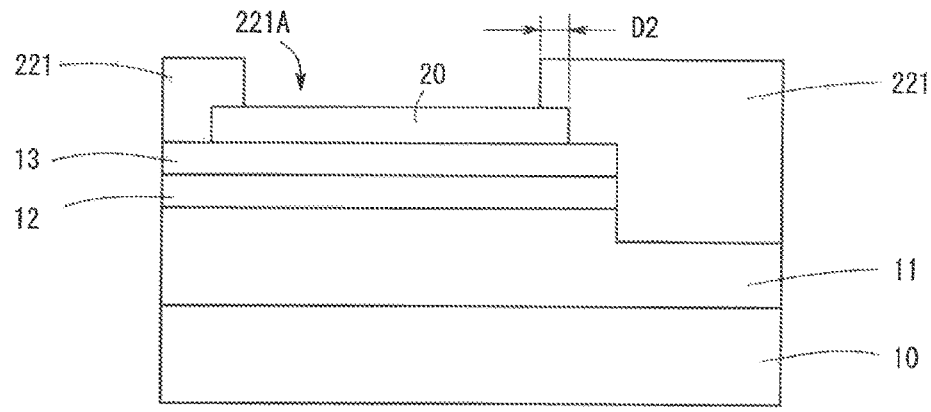
FIGS. 5A to 5D are sketches showing processes for producing a light-emitting device according to Embodiment 2.
Figure 5B:
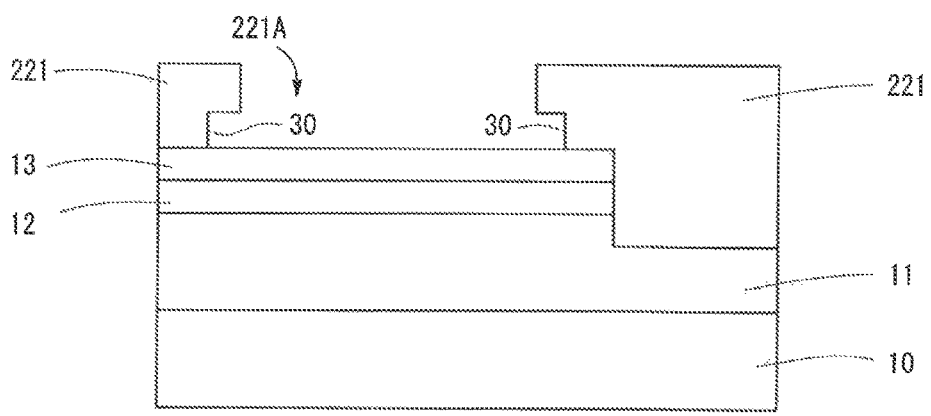

After dry etching to expose the n-type layer 11, a resist layer 221 having an opening 221A is formed through photolithography on the p-type layer 13 and the n-type layer 11 exposed in the previous step. The opening 221A has a pattern to be enclosed in the sacrificial layer 20 in a plan view. That is, the contour of the sacrificial layer 20 is disposed outside the contour of the opening 221A. The center of the surface of the sacrificial layer 20 is exposed by the opening 221A, and the ends of the surface of the sacrificial layer 20 are covered with the resist layer 221 (refer to FIG. 5A). That is, the resist layer 221 is formed so as to be overlapped at the ends of the sacrificial layer 20, and the resist layer 221 is continuously formed over the ends of the surface of the sacrificial layer 20, the side surfaces of the sacrificial layer 20, and the surface of the p-type layer 13. By forming the resist layer 221 in this way, a space is eliminated between the sacrificial layer 20 and the resist layer 221 so as to come into contact with each other.

The opening 221A has any pattern as long as the opening 221A is enclosed in the sacrificial layer 20 in a plan view. The pattern of the opening 221A preferably has a similar reduced shape as the pattern of the sacrificial layer 20. A width D2 (a width of a region where the resist layer 221 is formed at the end of the surface of the sacrificial layer 20) for overlapping the resist layer 221 is uniform, thereby facilitating the removal of the entire sacrificial layer 20 in the subsequent step.

Next, the sacrificial layer 20 is wet etched using an acid-based etching solution such as a buffered hydrofluoric acid. At this time, a region having the resist layer 221 as well as a region having no resist layer 221 on the sacrificial layer 20 is entirely removed by side etching. Through the removal of the sacrificial layer 20, a clean surface with which the resist has not come into contact is exposed in a region for forming the reflective electrode 214 of the surface of the p-type layer 13. No space is provided between the sacrificial layer 20 and the resist layer 221. If there is the space, the resist is attached to a region corresponding to the space of the surface of the p-type layer 13 when patterning the resist layer 221. However, there is no space, a region having no resist layer 221 of the surface of the p-type layer 13 is entirely a clean surface with which the resist has not come into contact.

The sacrificial layer 20 below the resist layer 221 is removed by side etching. As a result, a recess is formed at the side surface lower parts of the opening 221A of the resist layer 221, thereby generating a level difference.

To facilitate side etching, the sacrificial layer 20 is preferably wet etched without processing the surface of the device with hexamethyldisilazane (HMDS) before the formation of the resist layer 221. The HMDS treatment is a surface treatment using hexamethyldisilazane (HMDS). HMDS treatment is usually carried out to increase the adhesion of the resist. However, in Embodiment 2, the adhesion between the sacrificial layer 20 and the resist layer 221 is increased by HMDS treatment because the resist layer 221 is in contact with the sacrificial layer 20. This makes side etching difficult, and the entire sacrificial layer 20 is hardly removed. Therefore, the adhesion between the sacrificial layer 20 and the resist layer 221 can be decreased by not carrying out HMDS treatment, thereby facilitating the removal of the entire sacrificial layer 20 by side etching.

Figure 5C:
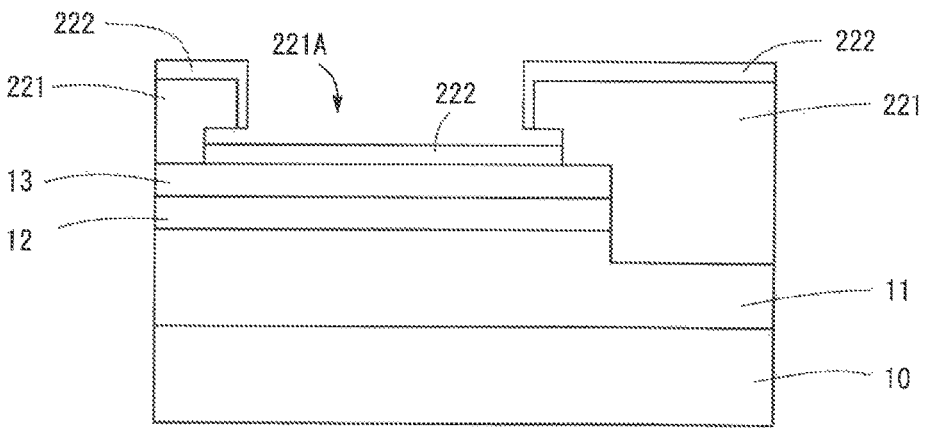

Subsequently, a reflective film 222 is formed by sputtering on the p-type layer 13 and the resist layer 221 (refer to FIG. 5C). Vapor deposition may be used other than sputtering. Since there is a concave 30 (level difference) having a ring shape along the side surface lower parts of the opening 221A of the resist layer 221, a step disconnection of the reflective film 222 occurs or the reflective film 222 is extremely thin at these level differences.

Figure 5D:
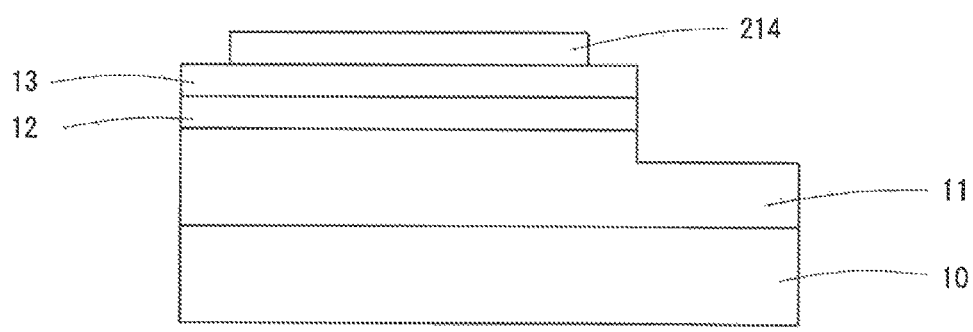

Next, the resist layer 221 is removed using a resist stripper. Thus, the reflective film 222 on the resist layer 221 is removed, and only the reflective film 222 on the p-type layer 13 is left to form the reflective electrode 214 (refer to FIG. 5D). Since a step disconnection of the reflective film 222 occurs or the reflective film 222 is extremely thin at the level differences at the side surface lower parts of the opening 221A, the reflective film 222 on the p-type layer 13 is accurately separated from the reflective film 222 on other region (on the resist layer 221) at these positions. Therefore, the pattern accuracy of the reflective electrode 214 is improved. No space is provided between the sacrificial layer 20 and the resist layer 221, and the entire surface of the p-type layer 13 with which the reflective electrode 214 is in contact is a clean surface with which the resist has not come into contact. Therefore, the effect of suppressing the increase of the contact resistance is higher than that in Embodiment 1.

The width D2 (the width of the region where the resist layer 221 is formed at the ends of the surface of the sacrificial layer 20) for overlapping the resist layer 221 is preferably more than 0 μm to not more than 5 μm. Within this range, the reflective film 222 can be accurately formed even at a region shadowed by the level differences at the side surface lower parts of the opening 221A of the resist layer 221. When the sacrificial layer 20 at a level difference region is removed by side etching, the entire sacrificial layer 20 can be easily removed. The range of the width D2 is, more preferably, more than 0 μm and not more than 3 μm, and further preferably, 1 μm to 3 μm.

Variations

In the method for producing a light-emitting device according to Embodiments 1 and 2, dry etching is performed to expose the n-type layer 11 as shown in FIG. 2C before the formation step of forming the reflective electrode 14 in FIGS. 3A to 3D after the formation step of forming the sacrificial layer 20 in FIG. 2B. However, after the formation of the reflective electrode 14 in FIGS. 3A to 3D, dry etching may be performed to expose the n-type layer 11. In this case, a restriction is sometimes imposed so as not to affect the reflective electrode 14 on the treatment of the resist mask used in dry etching, for example, the type of resist stripper or the post treatment method such as heat treatment and asking after resist removal. As in Embodiments 1 and 2, dry etching is preferably performed to expose the n-type layer 11 before the formation of the reflective electrode 14, because no such restriction is imposed.

The opening of the resist layer in the resist layer formation step is not limited to the opening of Embodiments 1 and 2. The opening may have any pattern as long as the sacrificial layer is exposed.

The present invention is applicable to a light-emitting device having any emission wavelength, and effective specifically to an ultraviolet light-emitting device. A material having a high reflectance in the ultraviolet region needs to be patterned through lift-off because wet etching is difficult. According to the present invention, the reflective electrode can be formed through lift-off without causing the increase of the contact resistance due to the residue of resist.

The light-emitting device according to Embodiment 1 is a flip-chip type light-emitting device. The present invention is not limited to this, and is applicable to a light-emitting device having any structure in which the reflective electrode is formed on the p-type layer.

The light-emitting device produced according to the present invention can be employed as a light source of a display apparatus or an illumination apparatus.

What is claimed is:

1. A method for producing a Group III nitride semiconductor light-emitting device having a reflective electrode on a p-type layer, the method comprising:
   forming a sacrificial layer on a region for forming the reflective electrode later on the p-type layer;
   forming a resist layer with an opening on the p-type layer, the opening exposing a surface of the sacrificial layer in a bottom of the opening;
   removing the sacrificial layer entirely by wet etching;
   forming a reflective film on the p-type layer and the resist layer; and
   forming the reflective electrode by removing the resist layer and the reflective film on the resist layer to leave the reflective film on the p-type layer, wherein the forming a resist layer is to form the resist layer so that the opening encloses the sacrificial layer in a plan view and a space is provided between a side surface of the sacrificial layer and a side surface of the resist layer.

2. The method for producing a light-emitting device according to claim 1, wherein dry etching is performed to expose the n-type layer before the forming a resist layer after the forming a sacrificial layer.

3. The method for producing a light-emitting device according to claim 2, wherein the reflective electrode comprises at least one selected from a group consisting of Ru, Rh, and Pt.

4. The method for producing a light-emitting device according to claim 2, wherein the reflective electrode comprises Ag alloy containing Au.

5. The method for producing a light-emitting device according to claim 2, wherein the reflective electrode is a layered film.

6. The method for producing a light-emitting device according to claim 1, wherein the reflective electrode comprises at least one selected from a group consisting of Ru, Rh, and Pt.

7. The method for producing a light-emitting device according to claim 6, wherein the reflective electrode is a layered film.

8. The method for producing a light-emitting device according to claim 1, wherein the reflective electrode comprises Ag alloy containing Au.

9. The method for producing a light-emitting device according to claim 8, wherein the reflective electrode is a layered film.

10. The method for producing a light-emitting device according to claim 1, wherein the reflective electrode is a layered film.

11. The method for producing a light-emitting device according to claim 1, wherein the light-emitting device is an ultraviolet light-emitting device.

* * * * *